United States Patent [19]

Flamm

[11] Patent Number: 5,097,337
[45] Date of Patent: Mar. 17, 1992

[54] APPARATUS AND METHOD FOR LIMITING DIGITAL VIDEO SIGNALS

[75] Inventor: Peter M. Flamm, March-Buchheim, Fed. Rep. of Germany

[73] Assignee: Deutsche ITT Industries GmbH, Freiburg, Fed. Rep. of Germany

[21] Appl. No.: 609,505

[22] Filed: Nov. 6, 1990

[30] Foreign Application Priority Data

Nov. 18, 1989 [EP] European Pat. Off. ............ 89121401

[51] Int. Cl.$^5$ .............................................. H04N 5/14
[52] U.S. Cl. ...................................... 358/170; 358/166
[58] Field of Search ............... 358/167, 166, 170, 177, 358/36, 37, 138, 22, 13, 160, 156, 172, 178; 307/540, 546, 553, 555; 328/168, 169, 175

[56] References Cited

U.S. PATENT DOCUMENTS 4,684,989 8/1987 Roeder ............................ 358/167

FOREIGN PATENT DOCUMENTS 0106000 4/1984 European Pat. Off. .
0342892 11/1989 European Pat. Off. .
60-130987 7/1985 Japan .

OTHER PUBLICATIONS

Peter Draheim, "Digitalisierung der Video-Signalverabeitung Beispel: Video-Kassettenrecorder", Electronik, No. 57, 1984, pp. 97–100.

*Primary Examiner*—James J. Groody
*Assistant Examiner*—Sherrie Hsia
*Attorney, Agent, or Firm*—Thomas L. Peterson

[57] ABSTRACT

A digital limiter for processing a digital video signal includes a limiter stage whose output is subtracted from the input to the stage in a subtracting stage. The resulting difference signal is accumulated by means of an accumulating device. The accumulated signal is added to the digital video signal to be processed. The accumulator provides a memory function for the signal component clipped in the limiter. It also includes a leakage device, so that the accumulated signal can decrease again after the start of limiting action.

18 Claims, 2 Drawing Sheets

APPARATUS AND METHOD FOR LIMITING DIGITAL VIDEO SIGNALS

BACKGROUND OF THE INVENTION

1. Field of the Invention

The present invention relates to a method of and an arrangement for limiting the level of a video signal present in digital form.

2. Description of the Related Art

Ever since digital integrated circuits became available which can be operated at sufficiently high clock rates, the digitization of video-signal processing has played a significant part in the design television receivers and video-cassette recorders (VCRs). As described in "Elektronik-Sonderheft," No. 57, 1984, pages 97-100, in video-cassette recorders, the luminance information of the originally amplitude-modulated composite color signal to be recorded on magnetic tape is converted into a frequency-modulated signal in order to take advantage of the higher noise immunity of frequency-modulated signals. In connection with the frequency modulation, preemphasis is applied, i.e., the high frequencies of the video signals are emphasized before the signal reaches the frequency modulator. Luminance steps which occur in a television picture on sudden changes from black to white, e.g., in the presentation of sharp contours of objects, contain high frequency components. During preemphasis, these would result in correspondingly high instantaneous frequencies of the frequency-modulated signal. Recording such high frequencies on magnetic tape is problematic. In addition, the frequency modulator would be overloaded by such high-frequency signal components.

To avoid these problems, signal limiting is necessary before the preemphasis process.

In the reproducing portion of the video recorder, deemphasis is applied which counteracts the preemphasis used in the recording portion in a complementary fashion to achieve as perfect a reproduction of the recorded video information as possible. In the deemphasis process, high frequency components are correspondingly lowered.

The limiting before the preemphasis process falsifies the video information to be recorded. As a result, a sudden change from black to white, for example, will be reproduced on the screen not "clean", but only in a low-contrast, blurred form.

SUMMARY OF THE INVENTION

It is the object of the invention to counteract the problems caused by digital limiting of digitally processed video signals. This object is attained by a method and by a device as described and claimed below.

With the method according to the invention, it is ensured by digital means that the information part clipped during limiting is not lost but is still available after the end of the start of limiting action because of a memory function, and is sent along with the video signal for further processing.

The result is a clear improvement in the quality of the picture information displayed on the screen. A sudden black-white transition in the picture information is displayed with much stronger contrast than without the use of the limiting method in accordance with the invention.

The memory function for the digitally limiter digital video signal is implemented by forming, from the start of limiting action, the difference between the limiter input signal and the limiter output signal in digital form, accumulating or integrating the resulting difference signal over time with the aid of an accumulator, adding part of the accumulated signal to the video signal to be applied to the limiter, and subtracting part of the accumulated signal from the signal to be accumulated. At least the part to be subtracted is a fraction of the accumulated signal Preferably, this also applies to the part of the accumulated signal which is added to the video signal to be applied to the limiter.

If no limiting takes place, there will be no difference signal that can be accumulated. In that case, no additional component will be added to the video signal to be applied to the limiter. If limiting is provided for the digital video signal, a difference signal is obtained which is accumulated or integrated over time, so that the accumulated signal will represent the duration and strength of the video-signal portion clipped by the limiter. Even when the limiting and, thus, the difference signal end, part of the accumulated signal continues to be added to the video signal applied to the limiter, this part being the greater the longer the limiting lasts and the farther the limited signal exceeded the threshold of limitation. Since a fraction of the accumulated signal with negative sign is fed back to the input of the accumulator, the latter slowly empties after the end of the limiting action. The memory function thus ends after a length of time which depends on the strength of the accumulated signal.

The invention makes it possible to realize such a memory function by digital means and in the processing of digital video signals. Since the parts of the accumulated signal which are added to the video signal to be applied to the limiter or subtracted from the signal to be accumulated can be formed with the aid of multiplier stages which form a particular coefficient of the accumulated signal, high flexibility in the determination of said parts of the accumulated signal can be achieved in a very simple manner.

In the case of the limiter function, too, the digital signal processing provides high flexibility. In a preferred embodiment, the limiter function is implemented with a ROM table. By simply programming the ROM containing this table, soft starts of limiting action can be implemented in any manner desired.

The difference signal is preferably applied to the accumulating stage through an additional multiplier stage in order to have further flexibility in the design of the memory function.

BRIEF DESCRIPTION OF THE DRAWINGS

Further details and aspects of the invention will now be explained by way of example with reference to the accompanying drawings, in which.

DETAILED DESCRIPTION OF THE PREFERRED EMBODIMENT

Figure 1:
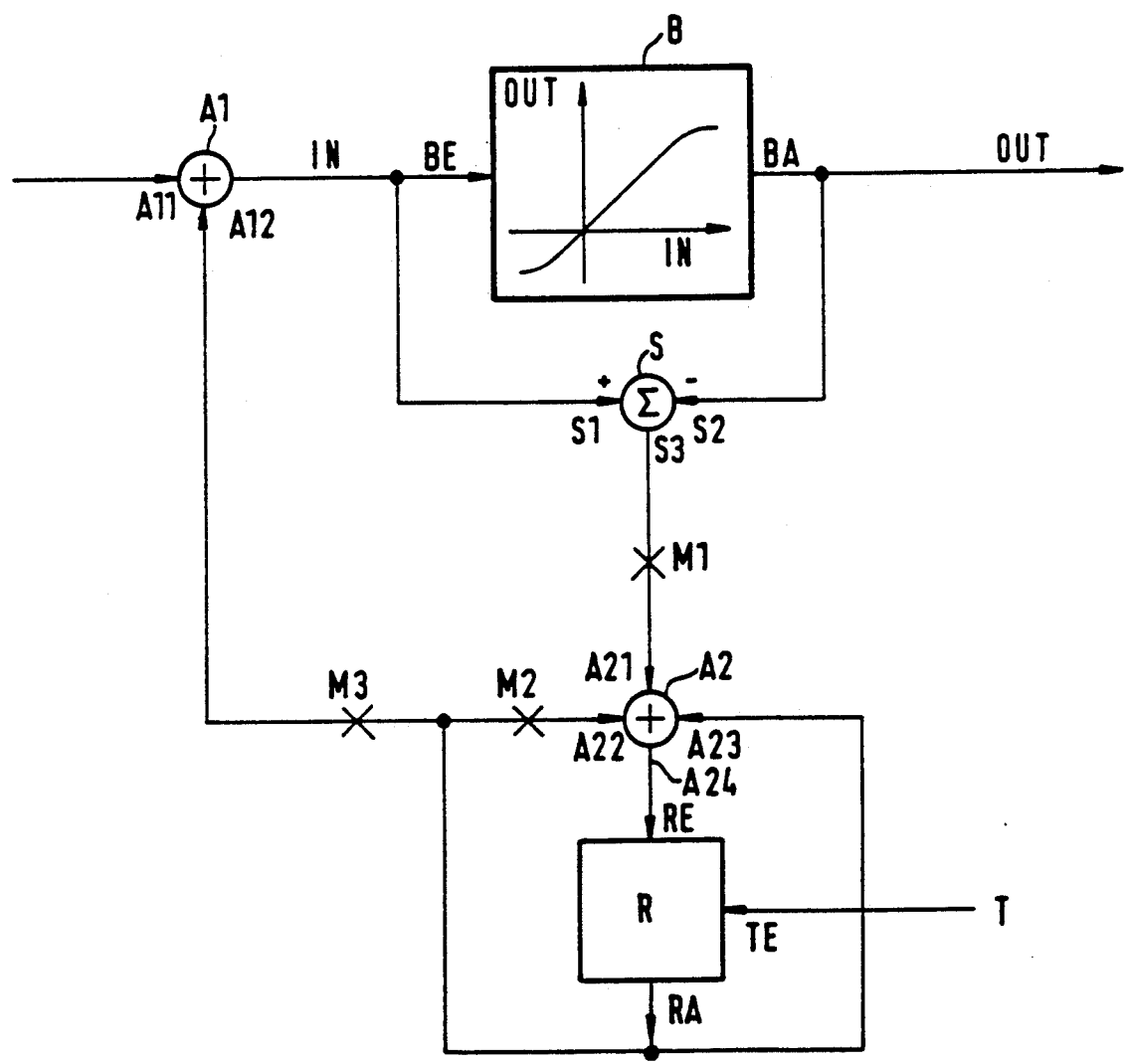
FIG. 1 is a block diagram of a preferred embodiment of a digital limited in accordance with the invention.

Referring to FIG. 1, the embodiment of a digital limiter in accordance with the invention includes a limiter stage B with an input BE and an output BA. The input BE is preceded by a first adding stage A1 having a first input A11 and a second input A12. A subtracting stage S has a first input S1 for a signal to be added and a second input S2 for a signal to be subtracted. The adding input S1 and the subtracting input S2 are connected, respectively, to the input BE and the output BA of the limiter stage B. An output S3 of the subtracting stage is connected via a first multiplier stage M1 to a first input A21 of a second adding stage A2. The adding stage A2 has second input A22 and a third input A23 An output A24 of the second adder A2 is connected to an input RE of a register R. An output RA of the register R is connected to the input A23 of the second adder A2 direct and to the input A22 of this adder through a second multiplier stage M2. The output RA is also connected via a third multiplier stage M3 to the second input A12 of the first adding stage A1. The register R has a clock input TE, through which a clock signal is applied to the register.

The limiter stage B has a characteristic as is shown by way of example in the block of the limiter B For both positive and negative input signals, the limiting characteristic first rises linearly at an angle of 45°, i.e., in this region, the limiter stage B has unity gain. Upon reaching a positive or negative threshold level, the limiting characteristic shows a soft transition to a portion running parallel to the abscissa.

The limiter shown in FIG. 1 is a digital limiter. The input A11 of the first adding stage A1 is fed with a video signal in digital form. The limiter stage B must thus process a digital signal. It is preferably implemented with a ROM table. In this ROM table, each video-signal value which can be applied to the input BE is assigned an output signal value, which is provided at the output BA. As long as the values of the video signal do not lie in the limiting portion of the limiting characteristic, the signal values at the output BA and the input BE are identical. In that case, equal signal values are applied to the two inputs S1 and S2 of the subtracting stage S, so that no output signal appears at the output S3 of this stage.

After the start of the limiting action of the limiter stage B, the value of the signal appearing at the output BA decreases in relation to the value of the signal at the input BE. As a result, the output S3 of the subtracting stage S provides a signal which is a measure of how far the signal at the input BE exceeds the positive or negative threshold level. This output signal is fed through the first multiplier stage M1 to the first input A21 of the second adding stage A2, from whose output A24 it is applied to the register R. From the output RA of the register R, the signal is then applied to the third input A23 of the second adding stage A2, which thus adds it to the signal applied to the input A21 from the multiplier stage M1. The adding stage A2 and the register R thus form an accumulator which accumulates or integrates the signal from the output S3 of the subtracting stage S over time.

The multiplier stage M1 multiplies the output signal from the subtracting stage S by a coefficient which determines the strength with which the output signal from the subtracting stage S is fed into the accumulator.

The multiplier stage M2 multiplies the signal fed back from the output RA of the register R to the input A22 of the adding stage A2 by a coefficient K2 which lies between 0 and −1.

The multiplier stage M3 multiplies the signal fed from the output RA of the register R to the input A12 of the first adding stage A1 by a coefficient K3 which determines the strength with which the accumulated signal is fed to the first adding stage A1, and, thus, added to the video signal which is applied to the input BE of the limiter stage B. The coefficient K3 can be chosen arbitrarily; it preferably lies in the range between 0 and +1. The coefficients K2 and K3 may, for example, be equal in magnitude, i.e., K2 = −K3. If the coefficients are even powers of two, and binary numbers are to be multiplied, the multipliers can be implemented by a simple arithmetic shift.

Figure 2:
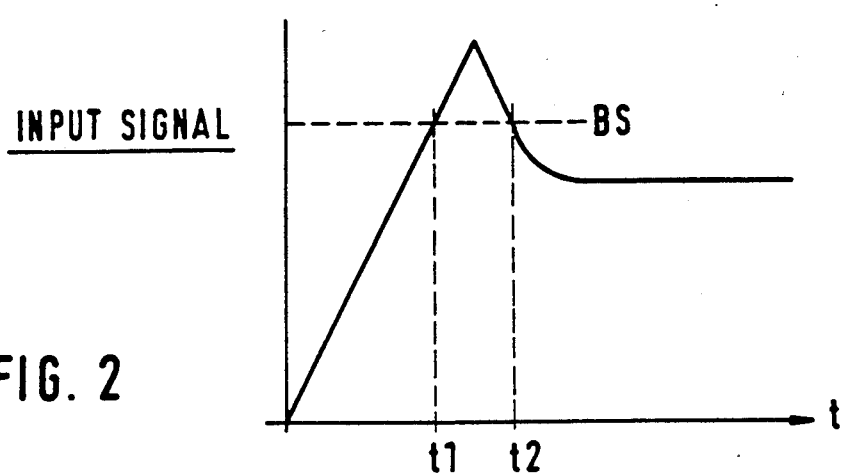
FIG. 2 shows an example of an input signal applied to the limiter of FIG. 1.

The operation of the limiter shown in FIG. 1 will now be explained with the aid of FIGS. 2 and 3.

As long as the input to the limiter stage B is below the threshold level BS, as, for example, in the period between 0 and t1, the input signal and the output signal are equal, so that the subtracting stage s provides no output signal. The accumulator formed by the register R and the adding stage A2 thus remains empty. When the input signal exceeds the threshold level BS at the instant t1 (for simplicity, a hard start of limiting action is shown in FIGS. 2 and 3), the output of the limiter stage B will remain at a signal value corresponding to the threshold level BS until the input signal falls below the threshold level BS again at the instant t2. During the period between t1 and t2, the value of the input signal is greater than the value of the output signal, so that the output S3 of the subtracting stage S provides a signal whose value is equal to the value by which the input signal exceeds the threshold level Bs This output signal from the subtracting stage S, after being multiplied by the coefficient K1, is accumulated by means of the accumulator comprising the adding stage A2 and the register R. The more and the longer the input signal exceeds the threshold level BS, the larger the accumulated signal will become. The accumulated signal thus represents a measure of the duration for which and of the extent to which the threshold level BS is exceeded. The accumulator A2, R thus performs a "memory function" by means of which the energy content of the signal component clipped by the limiter stage B is retained.

Because of the negative coefficient K2 of the multiplier stage M2, a fraction of the accumulated signal is continuously subtracted from the signal to be accumulated. In order that, despite this subtraction, accumulation of the clipped signal component can take place during a start of limiting action, that fraction of the accumulated signal which is subtracted in the accumulation process must be less than the fraction which is added in the accumulation process. If, as in the example illustrated in FIG. 1, the accumulated signal is fed from the output RA of the register R to the input A23 of the adding stage A2 unchanged, the coefficient K2 of the multiplier stage M2 must satisfy the relation $$0 < K2 < -1$$

If, for one reason or another, the accumulated output signal were fed back via the right-hand feedback loop of FIG. 1 to the adding stage A2 with a coefficient other than 1, the coefficient would have to be adapted correspondingly. Generally speaking, the multiplier stage M2 in the left-hand feedback loop of FIG. 1 is to introduce a "leakage effect" for the accumulation process which is weaker than the accumulation taking place via the right-hand feedback loop of FIG. 1.

When the start of limiting action has ended, so that the signal values at the input BE and the output BA of the limiter stage B are the same again, the output signal from the subtracting stage s stops. The accumulated signal, however, is still present at the output RA of the register R and is added via the multiplier stage M3 and the adding stage A1 to the digital video signal to be processed. Because of the "leakage effect" of the multiplier stage M2 with the negative coefficient K2, the accumulated signal value gradually decreases. Via the multiplier stage M3 and the adding stage A1, a signal component is therefore added to the video signal to be processed which is equal to the accumulated signal value which is decreasing because of the leakage effect, multiplied by the coefficient K3. After the start of limiting action, a signal component is thus added to the then appearing video signal for a given duration, the duration and the strength of the added signal corresponding to the accumulated signal at the end of the start of limiting action. The more and the longer the video signal exceeded the threshold level BS during the limiting, the stronger and the longer the signal component added to the video signal after the start of limiting action because of the memory function will be.

Figure 3:
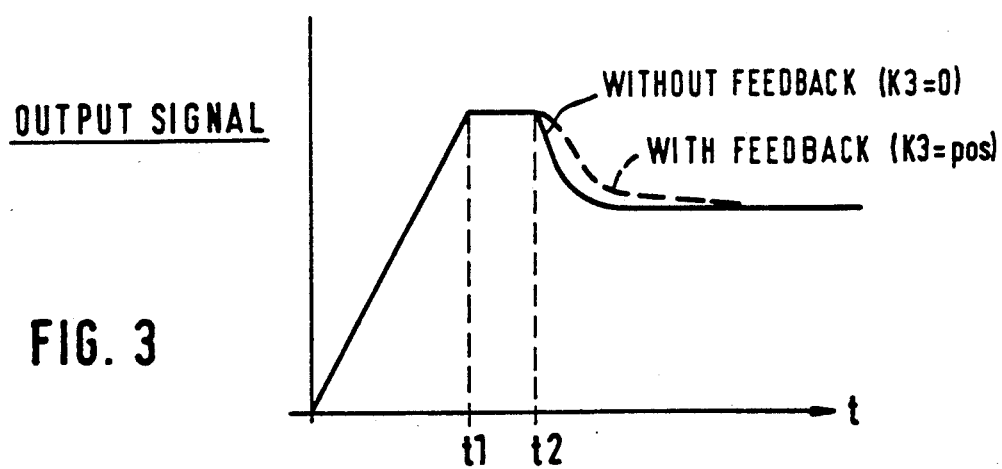
FIG. 3 shows the associated output signal from the limiter of FIG. 1.

This is illustrated graphically in FIG. 3. If the memory function of the accumulator were not available, the output signal would be identical to the input signal from the instant t2. This is shown in FIG. 3 by a solid line. If the memory function of the accumulator can become effective, the output signal has a higher characteristic than the input signal from the instant t2. This is shown in FIG. 3 by a dashed line.

The coefficient K3 may be chosen as required Preferably, it satisfies the relation $$0 < K3 < 1$$

If K3 is made too large, too large a component of the accumulated signal will be fed back to the adding stage A1 immediately after the start of limiting action, i.e., immediately after the instant t2, and superimposed on the video signal to be processed. In that case, the start of limiting action may become too long because of this feedback. If the coefficient K3 is made too small, too small a component of the signal to be accumulated will be added to the video signal to be processed, so that the memory effect will be too weak, i.e., too little of the previously stored signal information will be superimposed on the video signal after the start of limiting action.

The invention provides a digital limiter for video signals present in digital form which is characterized by extreme flexibility. On the one hand, a limiting characteristic of any shape can be implemented, e.g., by the use of a ROM table for the limiter stage B. On the other hand, arbitrary characteristics of the accumulation and memory functions can be implemented by suitable choice of the coefficients of the multiplier stages M1 to M3. It is also readily possible to implement the two multiplier stages M2 and M3, for example, with variable coefficients K2 and K3, respectively, which would allow the user of a video recorder equipped with the limiter in accordance with the invention to set the memory function so that the character of the picture displayed on the screen will be to his taste.

What is claimed is:

1. A method of limiting the level of a video signal present in digital form during plural intervals, including a first interval followed by a second interval, by means of a limiter stage having a limiter stage input that receives a limiter stage input signal to be limited, said limiter stage further having a limiter stage output that provides a limiter stage output signal, said limiter stage having a predetermined limiting characteristic relating said limiter stage input signal to said limiter stage output signal, said method comprising the steps of:

subtracting said limiter stage output signal from said limiter stage input signal to generate a digital difference signal;

accumulating a signal responsive to said digital difference signal to generate an accumulated signal for each of said intervals;

multiplying said accumulated signal by a predetermined first coefficient to generate a first product signal;

adding said first product signal to the signal to be limited to generate said limiter stage input signal; and multiplying said accumulated signal by a predetermined second coefficient to generate a second product signal;

wherein said accumulating step comprises the steps of:

subtracting said second product signal from the sum of (1) said accumulated signal generated in said first interval and (2) said signal responsive to said digital difference signal generated in said second interval; and saving the result of said subtracting step as said accumulated signal for said second interval.

2. A method as defined in claim 1, further including the step of multiplying said difference signal by a predetermined third coefficient to generate said signal responsive to said digital difference signal.

3. A method as defined in claim 1, wherein said first coefficient has a value in a range between 0 and +1.

4. A method as defined in claim 1, wherein said second coefficient has a value in a range between 0 and −1 so that said second product signal has the opposite sign of said accumulated signal, and wherein said step of subtracting said second product signal from said accumulated signal comprises adding said oppositely signed second product signal to said accumulated signal.

5. A method as defined in claim 2, wherein said first and second coefficients are equal in magnitude, and wherein said first coefficient is positive and said second coefficient is negative.

6. A method as defined in claim 1, wherein said predetermined limiting characteristic of said limiter stage corresponds to a limiting characteristic having an angle of 45° when said limiting stage is not limiting the level of said video signal such that the magnitude of said limiter stage output is equal to the magnitude of said limiter stage input and having an angle of less than 45° when said limiting stage is limiting the level of said video signal such that the magnitude of said limiter stage output is less than the magnitude of said limiter stage input.

7. A method as defined in claim 1, wherein said predetermined limiting characteristic is such that said limiter stage output signal is equal to said limiter stage input signal when said limiter stage input signal is below a predetermined magnitude, and wherein said limiter stage output signal is less than said limiter stage input signal when said limiter stage input signal exceeds said predetermined magnitude.

8. A method as defined in claim 1, wherein said limiter stage begins limiting said limiter stage output signal when said limiter stage input signal exceeds a predetermined magnitude, and wherein said predetermined limiting characteristic has a soft transition when said limiter stage input signal equals said predetermined magnitude.

9. A method as defined in claim 1, wherein said predetermined limiting characteristic is provided in a ROM table.

10. A digital limiter that limits the level of a video signal present in digital form in plural intervals, including first and second intervals, comprising:
- a limiter stage having a limiter stage input that receives a limiter stage input signal and a limiter stage output that generates a limiter stage output signal, said limiter stage having a predetermined limiting characteristic between said limiter stage input and said limiter stage output;
- a subtracting stage having a first subtracting stage input that receives said limiter stage input signal, a second subtracting stage input that receives said limiter stage output a signal, and a subtracting stage output that generates a digital difference signal by subtracting said limiter stage output signal from said limiter stage input signal;
- an accumulating stage that receives a signal responsive to said signal difference signal and that accumulates said signal responsive to said difference signal to generate an accumulated signal for each of said intervals;
- a first multiplier stage that multiplies said accumulated signal by a first coefficient having a positive sign to generate a first product signal;
- a second multiplier stage that multiplies said accumulated signal generated in said first interval by a second coefficient having a negative sign to generate a second product signal, said second product signal being added to said accumulated signal generated in said first interval and said signal responsive to said difference signal generated in said second interval to generate said accumulated signal in said second interval; and
- a first adding stage having a first input, a second input, and an output, said first input receiving said video signal, said second input receiving said first product signal, and said output connected to said input of said limiting stage to provide said limiter stage input signal.

11. A limiter as defined in claim 10, wherein said second coefficient has a value in the range between 0 and −1.

12. A limiter as defined in claim 10, further comprising a third multiplier stage interposed between said subtracting stage and said accumulating stage, said third multiplier stage multiplying said digital difference signal by a third coefficient to generate said signal responsive to said digital difference signal.

13. A limiter as defined in claim 10, wherein said first and second coefficients are equal in magnitude and opposite in sign.

14. A limiter as defined in claim 10, wherein said accumulating stage comprises:
- a register having an input and an output; and
- a second adding stage having an output connected to said input of said register and having a first input connected to receive said signal responsive to said digital difference signal generated by said subtracting stage, a second input connected to said output of said register, and a third input connect to receive said second product signal generated by said second multiplier stage.

15. A limiter as defined in claim 10, wherein said limiter stage has a limiting characteristic relating said limiter stage input signal to said limiter stage output signal, wherein said limiting characteristic rises at an angle of 45° when said limiting stage is not limiting the level of said video signal such that the magnitude of said limiter stage output is equal to the magnitude of said limiter stage input.

16. A limiter a defined in claim 10, wherein said limiter stage has a limiting characteristic relating said limiter stage input signal to said limiter stage output signal, said limiter limiting said limiter stage output signal when said limiter stage input signal exceeds a predetermined magnitude, wherein said limiting characteristic includes a soft transition when said limiter stage input signal equals said predetermined magnitude.

17. A limiter as defined in claim 10, wherein said limiter stage comprises a ROM having said limiting characteristic in a table therein.

18. A video recorder having digital video-signal-processing circuitry, said digital video-signal-processing circuitry comprising a digital limiter that limits a video signal therein present during plural intervals, including first and second intervals, to generate a limited video output signal, said digital limiter comprising:
- a limiter stage having a limiter stage input that receives a limiter stage input signal and a limiter stage output signal that generates a limiter stage output signal, said limiter stage having a predetermined limiting characteristic between said limiter stage input and said limiter stage output;
- a subtracting stage having a first subtracting stage input that receives said limiter stage input signal, a second subtracting stage input that receives said limiter stage output signal, and a subtracting stage output that generates a digital difference signal by subtracting said limiter stage output signal from said limiter stage input signal;
- an accumulating stage that receives a signal responsive to said signal difference signal and that accumulates said signal responsive to said difference signal to generate an accumulated signal for each of said intervals;
- a first multiplier stage that multiplies said accumulated signal by a first coefficient having a positive sign to generate a first product signal;
- a second multiplier stage that multiplies said accumulated signal generated in said first interval by a second coefficient having a negative sign to generate a second product signal, said second product signal being added to said accumulated signal generated in said first interval to thereby subtract said second product signal from said accumulated signal generated in said first interval to generate said accumulated signal for said second interval; and
- a first adding stage having a first input, a second input and an output, said first input receiving said video signal, said second input receiving said first product signal, and said output connected to said input of said limiting stage to provide said limiter stage input signal.

* * * * *